(12) United States Patent
Cheng et al.

(10) Patent No.: US 10,811,495 B2
(45) Date of Patent: Oct. 20, 2020

(54) VERTICAL FIELD EFFECT TRANSISTOR WITH UNIFORM GATE LENGTH

(71) Applicant: International Business Machines Corporation, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 87 days.

(21) Appl. No.: 15/792,969

(22) Filed: Oct. 25, 2017

(65) Prior Publication Data
US 2018/0061829 A1    Mar. 1, 2018

Related U.S. Application Data

(62) Division of application No. 15/220,972, filed on Jul. 27, 2016, now Pat. No. 9,935,101.

(51) Int. Cl.
*H01L 29/66* (2006.01)
*H01L 29/06* (2006.01)
(Continued)

(52) U.S. Cl.
CPC ...... *H01L 29/0649* (2013.01); *H01L 29/7827* (2013.01); *H01L 21/823437* (2013.01); *H01L 21/823487* (2013.01); *H01L 29/78642* (2013.01)

(58) Field of Classification Search
CPC ..... H01L 21/823437; H01L 21/823487; H01L 29/0649; H01L 29/7827; H01L 21/28556;
(Continued)

(56) References Cited

U.S. PATENT DOCUMENTS 6,060,746 A    5/2000 Bertin et al.
6,218,696 B1   4/2001 Radius
(Continued)

OTHER PUBLICATIONS

J.M. Hergenrother et al., "The Vertical Replacement-Gate (VRG) MOSFET," Solid-State Electronics, Jul. 2002, pp. 939-950, vol. 46.
(Continued)

*Primary Examiner* — Meiya Li
(74) *Attorney, Agent, or Firm* — Vazken Alexanian; Ryan, Mason & Lewis, LLP

(57) ABSTRACT

Fabrication of a semiconductor structure includes forming a set of two or more fins on a source/drain region formed on a substrate. A first mask layer and a second mask layer are formed on each fin. A spacer layer is formed on the source/drain region and between each fin, and a dielectric layer is formed on the spacer layer and along an exterior of each fin. A plurality of gate metal portions is created each having a thickness about equal to a target thickness. The first mask layer and an exposed portion of the dielectric layer are removed from each fin. An interlayer dielectric is deposited on the semiconductor structure. Portions of the interlayer dielectric and the gate metal are removed to a top of the second mask layer. The gate metal portions are each recessed to substantially the same depth.

20 Claims, 9 Drawing Sheets

(51) Int. Cl.
*H01L 29/78* (2006.01)
*H01L 21/8234* (2006.01)
*H01L 29/786* (2006.01)

(58) Field of Classification Search
CPC .......... H01L 21/3081; H01L 21/32136; H01L 21/823418; H01L 27/088; H01L 29/78642
See application file for complete search history.

(56) References Cited

U.S. PATENT DOCUMENTS

| | | |
|---|---|---|
| 6,383,860 B2 | 5/2002 | Maeda et al. |
| 6,638,823 B2 | 10/2003 | Cho et al. |
| 6,642,600 B2 | 11/2003 | Narazaki et al. |
| 6,787,402 B1 | 9/2004 | Yu |
| 7,176,089 B2 | 2/2007 | Furukawa et al. |
| 7,419,878 B2 | 9/2008 | Williams et al. |
| 7,446,025 B2 | 11/2008 | Cohen et al. |
| 7,811,890 B2 | 10/2010 | Hsu et al. |
| 8,212,311 B2 | 7/2012 | Masuoka et al. |
| 8,901,004 B2 | 12/2014 | Kamp et al. |
| 8,994,101 B2 | 3/2015 | Chang et al. |
| 2006/0022262 A1 | 2/2006 | Yoon et al. |
| 2007/0057309 A1* | 3/2007 | Song ................ H01L 27/115 257/314 |
| 2007/0117355 A1 | 5/2007 | Ueda et al. |
| 2013/0043539 A1 | 2/2013 | Chang et al. |
| 2013/0307037 A1 | 11/2013 | Masuoka et al. |
| 2014/0361384 A1 | 12/2014 | Liu |
| 2015/0187641 A1 | 7/2015 | Wang et al. |

OTHER PUBLICATIONS

List of IBM Patents or Patent Applications Treated as Related.

* cited by examiner

100

100

200

200

VERTICAL FIELD EFFECT TRANSISTOR WITH UNIFORM GATE LENGTH

BACKGROUND

Semiconductor devices are implemented in a large number of modern electronic devices. Semiconductor devices are comprised of integrated circuits (ICs) that are formed on semiconductor wafers or substrates. Specifically, semiconductor devices are fabricated by depositing thin film(s) over the substrates, and patterning the thin film(s) to form the ICs. ICs may be embodied as field-effect transistors (FETs), such as vertical FETs.

SUMMARY

Illustrative embodiments of the invention provide techniques for fabricating FET structures, such as a vertical FET structure. While illustrative embodiments are well-suited to improve operations of vertical FET structures, alternative embodiments may be implemented with other types of semiconductor structures.

For example, in one illustrative embodiment, a semiconductor structure comprises a substrate; a source/drain region formed on the substrate; a set of fins comprising two or more fins formed on the source/drain region, wherein the two or more fins includes sidewalls and a top surface; a first spacer layer formed on the source/drain region and between each of the two or more fins; a dielectric layer formed on the spacer layer and along the sidewalls of the two or more fins; and a plurality of gate metal portions on at least a portion of the on the dielectric layer formed on the sidewalls of the two or more fins. The plurality of gate metal portions each have a thickness about equal to a target thickness, and further wherein each gate metal portion is recessed to substantially a same depth.

In another illustrative embodiment, a method for fabricating a semiconductor structure comprises forming a set of fins having two or more fins on a source/drain region formed on a substrate. A mask is formed on each fin, the mask having a first mask layer and a second mask layer. A spacer layer is formed on the source/drain region and between each of the two or more fins, and a dielectric layer is formed on the spacer layer and along an exterior of each of the two or more fins. A plurality of gate metal portions is created each having a thickness about equal to a target thickness. The first mask layer and an exposed portion of the dielectric layer are removed from each fin. An interlayer dielectric is deposited on the semiconductor structure. Portions of the interlayer dielectric and the gate metal portions are removed to a top of the second mask layer. The gate metal portions are each recessed to substantially the same depth.

DETAILED DESCRIPTION

In illustrative embodiments, techniques are provided for fabricating semiconductor devices comprised of one or more vertical FETs. More particularly, illustrative embodiments provide techniques for fabricating semiconductor devices comprised of one or more vertical FETs each having a uniform gate length. As will be explained in illustrative embodiments, such fabrication techniques advantageously improve performance of the semiconductor device.

Furthermore, it is to be understood that embodiments discussed herein are not limited to the particular materials, features, and processing steps shown and described herein. In particular, with respect to fabrication (forming or processing) steps, it is to be emphasized that the descriptions provided herein are not intended to encompass all of the steps that may be used to form a functional integrated circuit device. Rather, certain steps that are commonly used in fabricating such devices are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about," "approximately" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example only, 1% or less than the stated amount. Also, in the figures, the illustrated scale of one layer, structure, and/or region relative to another layer, structure, and/or region is not necessarily intended to represent actual scale.

Figure 1A:
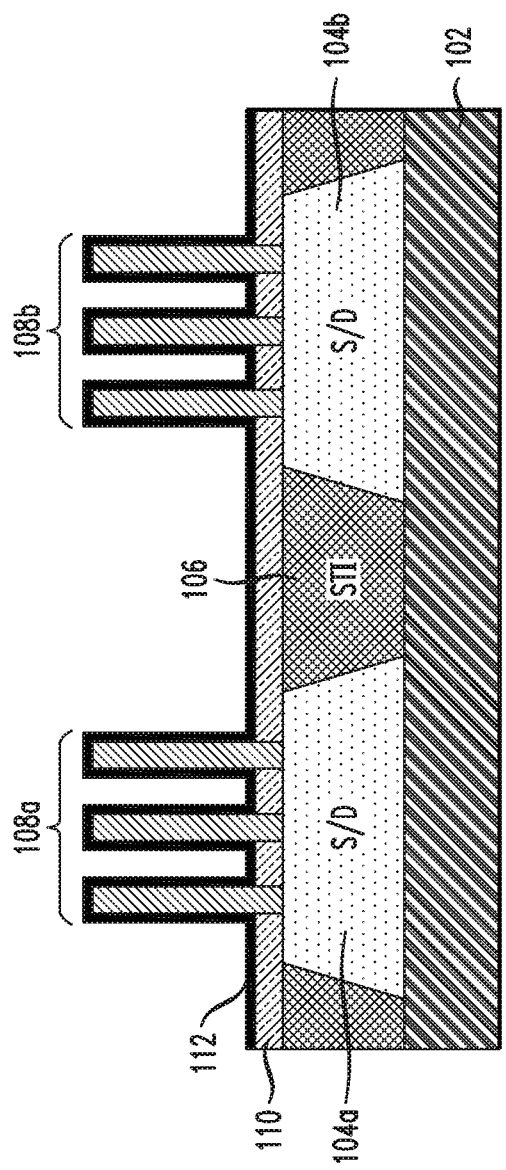
FIG. 1A is a schematic cross-sectional side view of a portion of a conventional semiconductor device at a first-intermediate fabrication stage.
Figure 1B:
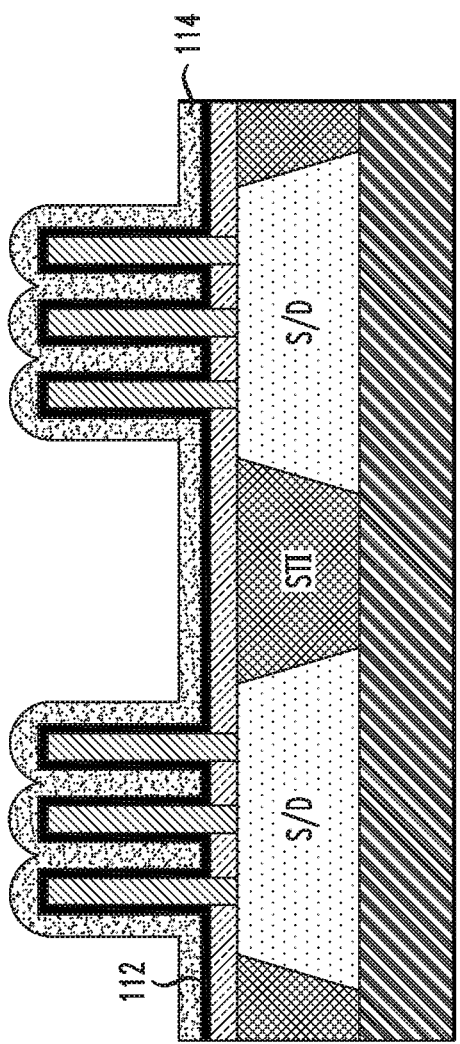
FIG. 1B is a schematic cross-sectional side view of a portion of a conventional semiconductor device at a second-intermediate fabrication stage.
Figure 1C:
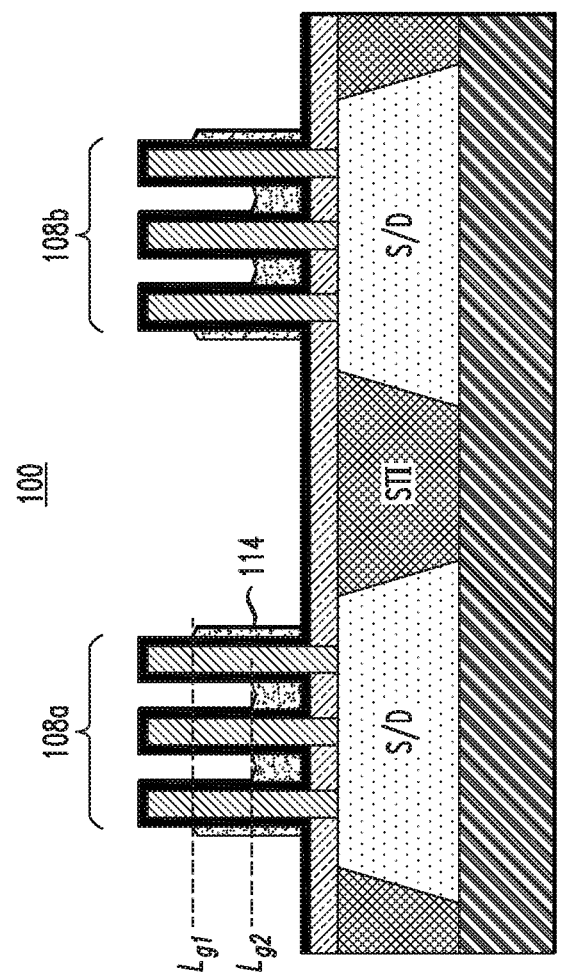
FIG. 1C is a schematic cross-sectional side view of a portion of a conventional semiconductor device at a third-intermediate fabrication stage.

FIGS. 1A-1C illustrate a conventional process of fabricating a semiconductor structure with one or more vertical FETs. FIG. 1A illustrates semiconductor structure 100 at a first intermediate fabrication stage. For the purpose of clarity, several fabrication steps leading up to the production of semiconductor structure 100 as illustrated in FIG. 1A are omitted. In other words, semiconductor structure 100 does not necessarily start out in the form illustrated in FIG. 1A, but may develop into the illustrated structure over one or more well-known processing steps which are not illustrated but are well-known to those of ordinary skill in the art.

Semiconductor structure 100 is shown having a silicon substrate 102. The substrate can be either bulk silicon or SOI. Formed on substrate 102 are source/drain region 104a and source/drain region 104b. Although two source/drain regions are shown in FIG. 1A, the number of source/drain regions should not be considered limiting. In one embodiment, one or more of source/drain regions 104a and 104b are highly doped. Formed between source/drain region 104a and source/drain region 104b is a shallow trench isolation (STI) oxide region 106. As is known in the art, an STI oxide region is used to prevent interaction between adjacent components of a semiconductor device. For example, the STI oxide region may be used to prevent electronic current leakage between the adjacent components of the semiconductor device.

Semiconductor structure 100 is further shown with set of fins 108a associated with source/drain region 104a and set of fins 108b associated with source/drain region 104b. Although two sets of fins are shown in FIG. 1A, this number should not be considered limiting. In this illustrative example, set of fins 108a and set of fins 108b each comprise three (3) fins. However, the number of fins should not be considered limiting. As is known, the fins may be formed with a doped silicon material.

Semiconductor structure 100 is further shown with a spacer 110. As is known in the art, spacer 110 is a thin insulating layer, such as for example, an oxide, SiNx, silicon boron carbonitride (SiBCN), or silicon oxycarbonitride (SiOCN) layer, used to separate source/drain regions 104a and 104b from gate metal that will be deposited on semiconductor structure 100. A layer of dielectric material 112 is formed along the outer surface, or exterior, of each fin, and along the top surface of spacer 110. Layer of dielectric material 112 serves as a gate dielectric. In one embodiment, the dielectric material is comprised of a material having a high dielectric constant i.e., a high-k material. A high-k material is one that has a dielectric constant that is large relative to that of silicon dioxide ($SiO_2$). As is known in the art, high-k dielectric materials allow for increased gate capacitance while minimizing leakage effects.

FIG. 1B illustrates semiconductor structure 100 at a second-intermediate fabrication stage. During this stage, gate metal 114 is deposited along layer of dielectric material 112. In one embodiment, gate metal 114 is deposited via atomic layer deposition (ALD). As is known in the art, ALD is a thin film deposition technique. ALD is performed by exposing separate gaseous precursors to the surface of the material. In contrast to chemical vapor deposition (CVD), in which gaseous precursors are present simultaneously in the reactor, ALD is performed as a series of sequential, non-overlapping pulses. Repeated exposure of the chemical precursors to the surface result in the deposition of the thin film. Specific details regarding the ALD process, including specific details regarding types of gaseous precursors that may be utilized in accordance with the embodiments described herein, are known in the art, and a further description thereof will not be provided.

FIG. 1C illustrates semiconductor structure 100 at a third-intermediate fabrication stage. During this stage, the gate length ($L_g$) is controlled. The gate length may refer to the height of the gate metal. To modify $L_g$ of gate metal 114, gate metal 114 is etched back. In one embodiment, gate metal 114 is etched back via reactive-ion itching (RIE). As is known in the art, RIE is a form of dry etching that uses chemically reactive plasma as an etchant. The plasma may be generated under low pressure (e.g., vacuum) conditions by an electromagnetic field. The high energy plasma ions that are generated collide with gate metal 114, resulting in the etching of gate metal 114. Specific details regarding the RIE process, including specific details regarding the method of operation of the RIE process in accordance with the embodiments described herein, are known in the art, and a further description thereof will not be provided.

It is realized herein that $L_g$ uniformity (i.e., uniform length of the gate material surrounding the fin) is an important consideration for vertical FET design. However, the etch rate during a dry etch process (e.g., RIE) may depend on many factors, one of them being the so-called "loading effect." The loading effect is a characteristic of a dry etching process whereby the etch rate depends on the surface area of the material to be etched. Note in FIG. 1B how the exposed surface area of portions of the gate material 114 on the outside of the sets of fins 108a and 108b (and between the two sets themselves) is greater as compared with the exposed surface area of portions of the gate material in between the fins of a given set. Due to the variability of the etch rate resulting from the variability of the surface area of the material being etched, the remnants of gate metal 114 may have a non-uniform gate length as seen in FIG. 1C, i.e., see $L_{g1}$ and $L_{g2}$. It is noted that $L_{g1}$ is greater than $L_{g2}$ because the exposed surface area of the gate material 114 outside and between the respective sets of fins is greater than the exposed surface area in between each fin of a given fin set.

It is realized herein that it would be advantageous to reduce the impact of the loading effect and maximize the uniformity of $L_g$ in order to provide for a more efficient semiconductor device.

Figure 2A:
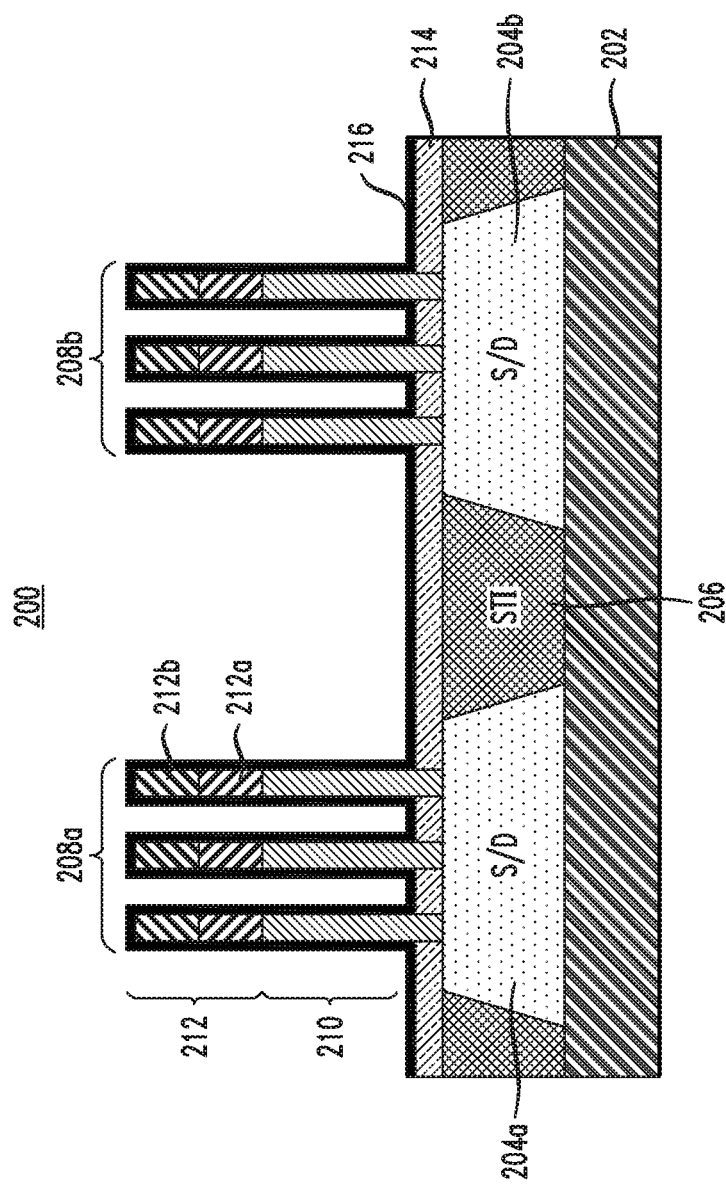
FIG. 2A is a schematic cross-sectional side view of a portion of a semiconductor device at a first-intermediate fabrication stage, according to an embodiment of the invention.

FIGS. 2A-2F illustrate an exemplary process for fabricating a semiconductor structure having gate metal with a uniform gate length ($L_g$). FIG. 2A illustrates a semiconductor structure 200 at a first-intermediate fabrication stage. For the purpose of clarity, several fabrication steps leading up to the production of the semiconductor structure 200 as illustrated in FIG. 2A are omitted. In other words, semiconductor structure 200 does not necessarily start out in the form illustrated in FIG. 2A, but may develop into the illustrated structure over one or more well-known processing steps which are not illustrated but are well-known to those of ordinary skill in the art. Also, note that the same reference numeral (200) is used to denote the semiconductor structure through the various intermediate fabrication stages illustrated in FIGS. 2A through 2F. Note also that semiconductor structure 200 can also be considered to be a semiconductor device and/or an integrated circuit, or some part thereof.

Semiconductor structure 200 is shown having a silicon substrate 202. Formed on substrate 202 are source/drain region 204a and source/drain region 204b. Although two source/drain regions are shown in FIG. 2A, the number of sources/drain regions should not be considered limiting. In one embodiment, one or more of source/drain regions 204a and 204b are highly doped. Formed between source/drain region 204a and source/drain region 204b is STI oxide region 206, which has the same or similar function as described above for STI region 106.

Semiconductor structure 200 is further shown with set of fins 208a associated with source/drain region 204a and set of fins 208b associated with source/drain region 204b. Although two sets of fins are shown in FIG. 2A, this number should not be considered limiting. In this illustrative example, set of fins 208a and set of fins 208b each comprise three (3) fins. However, the number of fins should not be considered limiting. As shown in FIG. 2A, each fin comprises a bottom portion 210 and a top portion 212. In one embodiment, bottom portion 210 is comprised of a doped silicon material, and top portion 212 is a mask. Additionally, top portion 212 may be a double-layer mask comprising a silicon nitride ($SiN_x$) layer 212a and a silicon dioxide ($SiO_2$) layer 212b.

Semiconductor structure 200 is further shown with spacer 214. Spacer 214 is a thin insulating layer, such as for example, an oxide, SiNx, SiBCN, or SiOCN, used to separate source/drain region 204a and source/drain region 204b from gate metal that will be deposited on semiconductor structure 200. A layer of dielectric material 216 is formed along the outer surface, or exterior, of each fin, and along the top surface of spacer 214. The same as or similar to layer 112 discussed above in FIG. 1A, layer of dielectric material 216 serves as a gate dielectric. In one embodiment, the dielectric material is comprised of a material having a high dielectric constant i.e., a high-k material.

Figure 2B:
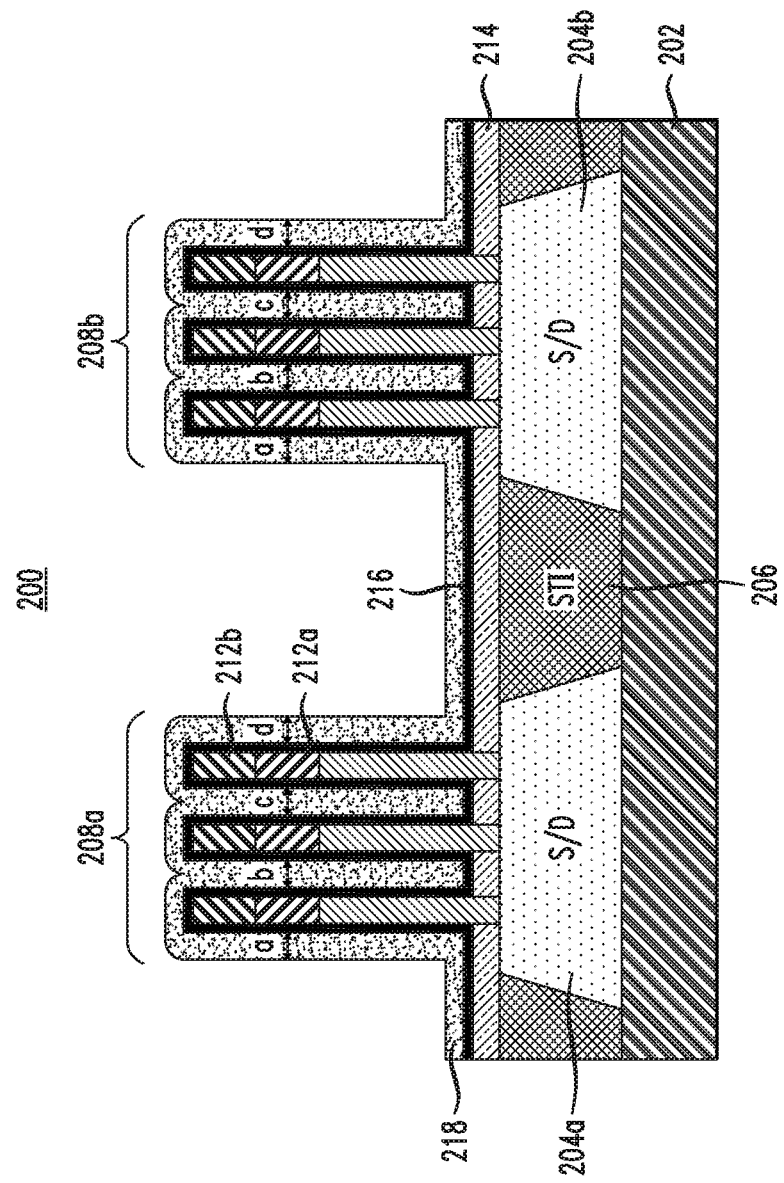
FIG. 2B is a schematic cross-sectional side view of a portion of a semiconductor device at a second-intermediate fabrication stage, according to an embodiment of the invention.

FIG. 2B illustrates semiconductor structure 200 at a second-intermediate fabrication stage. During this stage, gate metal 218 is deposited. In one embodiment, gate metal 218 is deposited along layer of dielectric material 216, as shown in FIG. 2B, via atomic layer deposition (ALD). The target thickness of the deposition should be substantially equal to the spacing between each fin of set of fins 208a and between each fin of set of fins 208b (e.g., length a=length b=length c=length d).

Figure 2C:
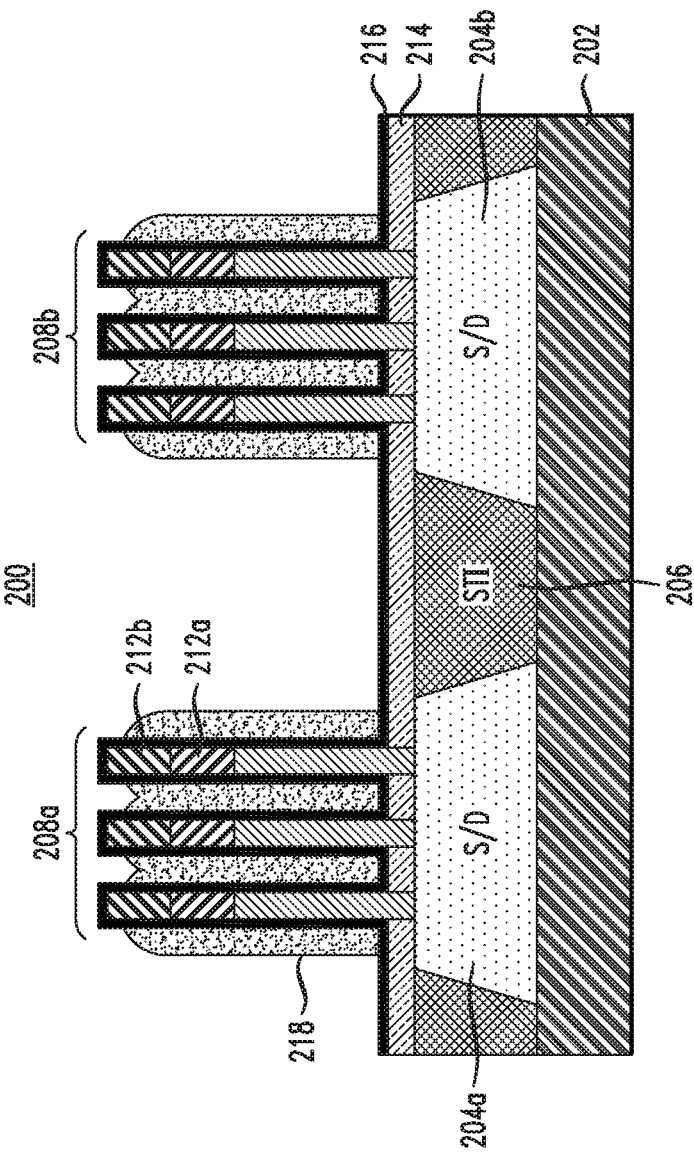
FIG. 2C is a schematic cross-sectional side view of a portion of a semiconductor device at a third-intermediate fabrication stage, according to an embodiment of the invention.

FIG. 2C illustrates semiconductor structure 200 at a third-intermediate fabrication stage. During this stage, an etch process is implemented to remove unwanted gate metal. In one embodiment, the etch process is a RIE process, as discussed above with reference to FIG. 1C. The unwanted gate metal includes the portion of gate metal 218 located between set of fins 208a and set of fins 208b, as shown in FIG. 2C. Additionally, the etch process is implemented to recess the portion of gate metal 218 on set of fins 208a and set of fins 208b. The recessed surface should be above $SiN_x$ layer 212a.

Figure 2D:
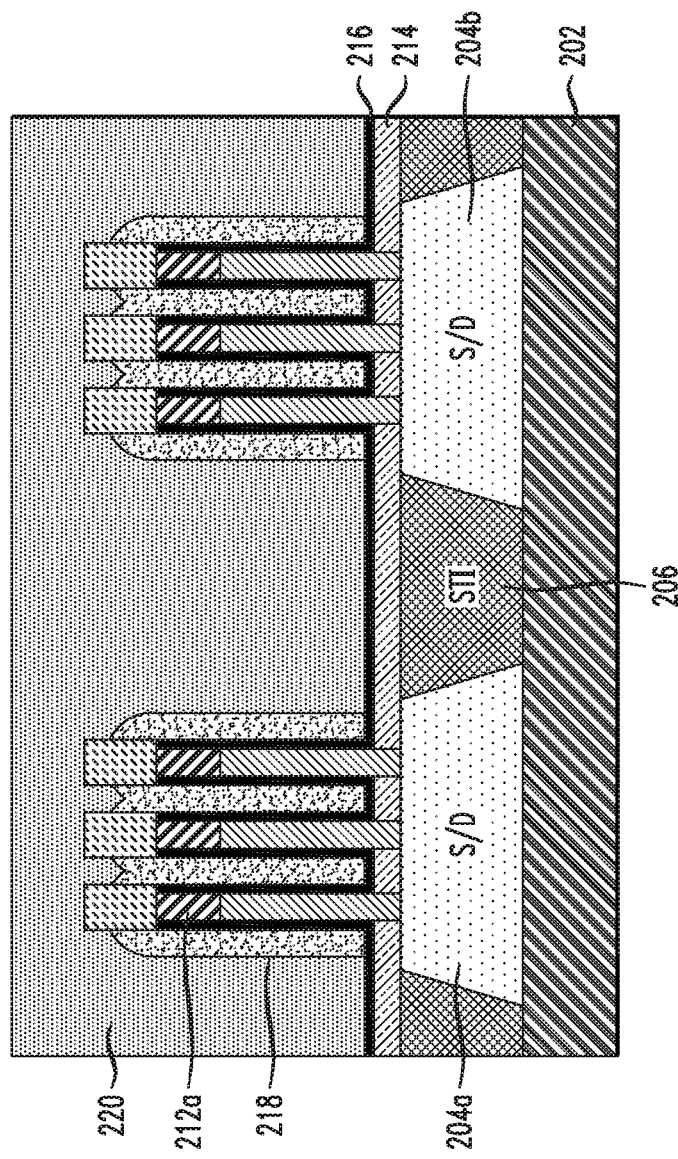
FIG. 2D is a schematic cross-sectional side view of a portion of a semiconductor device at a fourth-intermediate fabrication stage, according to an embodiment of the invention.

FIG. 2D illustrates semiconductor structure 200 at a fourth-intermediate fabrication stage. During this stage, exposed dielectric material 216 and $SiO_2$ layer 212b are removed, and gaps of semiconductor structure 200 are filled with interlayer dielectric 220. In one illustrative embodiment, a high aspect ratio process (HARP) is implemented to fill the gaps of semiconductor structure 200 with interlayer dielectric 220. HARP is a process developed by Applied Materials, Inc. (Santa Clara, Calif.) as a particular chemical vapor deposition (CVD) process to meet high aspect ratio gap-fill requirements. In HARP, a thermal process is used to reduce or eliminate the plasma damage to the device, enabling improved reliability. In one embodiment, interlayer dielectric 220 comprises an oxide material, such as $SiO_x$. It is to be appreciated that embodiments of the invention are not limited to use with HARP, but rather they may be applied with other alternative oxide material fill processes. That is, embodiments more generally fill the gaps of semiconductor structure 200 with an interlayer dielectric (MD) material.

Figure 2E:
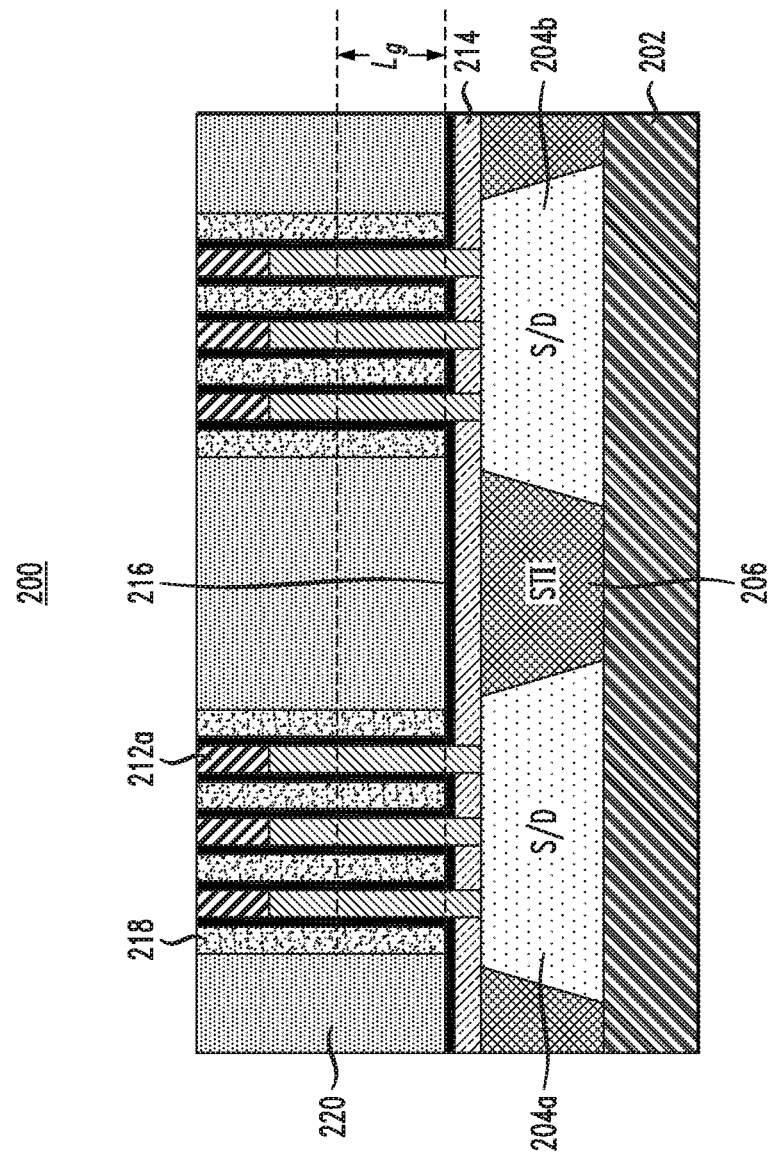
FIG. 2E is a schematic cross-sectional side view of a portion of a semiconductor device at a fifth-intermediate fabrication stage, according to an embodiment of the invention.

FIG. 2E illustrates semiconductor structure 200 at a fifth-intermediate fabrication stage. During this stage, gate metal 218 and interlayer dielectric 220 are removed until gate metal 218 is at a uniform height throughout semiconductor structure 200. In one embodiment, gate metal 218 and interlayer dielectric 220 are removed until the top of $SiN_x$ 212a is reached. The removal of the material may be performed via a chemical-mechanical planarization (CMP) process. Specific details regarding implementation of the CMP process are known in the art, and a further description thereof with not be provided herein.

As further shown in FIG. 2E, semiconductor structure 200 is associated with a gate length $L_g$. Lg corresponds to a target gate length for semiconductor structure 200. For example, as shown, the target gate length may be measured from the top of layer of dielectric material 216 to a target height along gate metal 218.

Figure 2F:
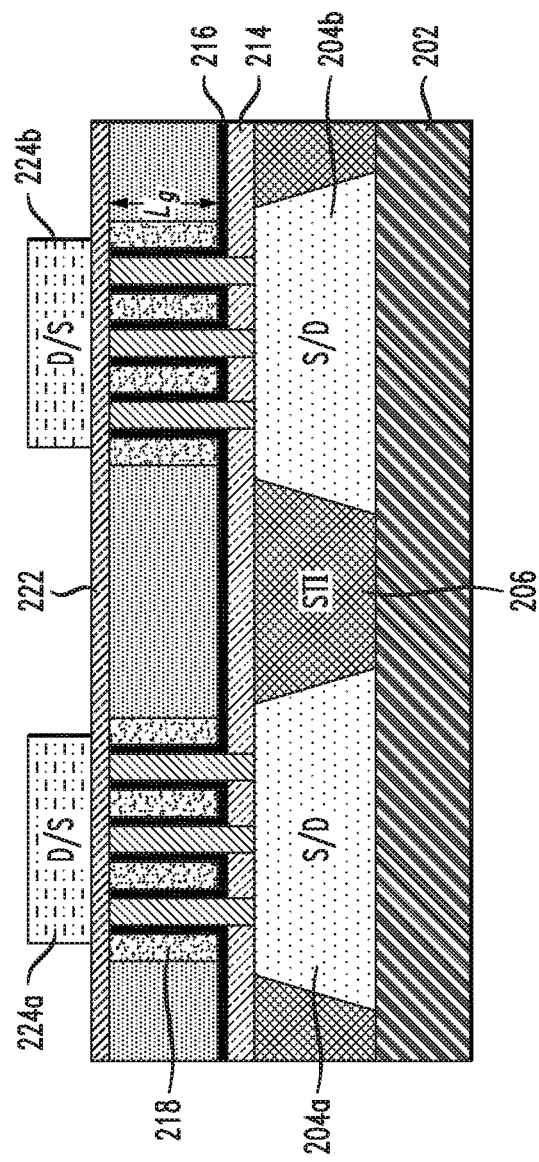
FIG. 2F is a schematic cross-sectional side view of a portion of a semiconductor device at a sixth-intermediate fabrication stage, according to an embodiment of the invention.

FIG. 2F illustrates semiconductor structure 200 at a sixth-intermediate fabrication stage. During this stage, a single or common etch process is performed to recess gate metal 218 to the target gate length Lg. In one embodiment, RIE is performed to recess gate metal 218 to the target gate length Lg. As may be seen in FIG. 2F, semiconductor structure 200 has a gate metal thickness substantially equal to the space between each fin of a vertical FET. Such uniformity in thickness corresponds to a uniform etching depth into all gaps, thereby leading to a substantially uniform $L_g$. After the etch process is performed to recess gate metal 218 to the target gate length Lg, spacer 222, drain/source region 224a and drain/source region 222b are formed on semiconductor structure 200 as shown. Accordingly, semiconductor structure 200 is formed comprising one or more vertical FETs having gates with a uniform gate length. It is to be understood that by "uniform" here, it is intended to comprise exactly uniform and approximately or substantially uniform.

Conventionally, as discussed above in the context of FIGS. 1A-1C, the gate metal on a semiconductor structured is recessed directly after its deposition. However, embodiments described herein implement a process to deposit dielectric material after the deposition of the gate metal, and prior to the recessing of the gate metal. This process enables elimination/reduction of the "loading effect," as explained above, in order to provide uniform gate length throughout the semiconductor structure, thereby increasing efficiency. It is critical to have a proper uniformity control in the manufacturing process. Longer gate length can lead to lower active driving current; shorter gate length causes large leakage current when the chip is idle. It is important to make sure the final gate length meets the design goal to ensure the overall performance/functionality of a chip.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A semiconductor structure, comprising:
   a substrate;
   a first source/drain region disposed on the substrate;
   a second source/drain region disposed on the substrate;
   a shallow trench isolation oxide region disposed between the first source/drain region and the second source/drain region;
   a first set of fins comprising two or more fins disposed on the first source/drain region;
   a second set of fins comprising two or more fins disposed on the second source/drain region, wherein each of the two or more fins of the first set of fins and the second set of fins includes sidewalls and a top surface;
   a first spacer layer disposed on each of the first source/drain region and the second source/drain region and between each of the two or more fins of the first set of fins and the second set of fins;
   a dielectric layer disposed on the first spacer layer and along each of the sidewalls of the two or more fins of the first set of fins and the second set of fins; and
   a plurality of gate metal portions on at least a portion of the dielectric layer that is disposed along each of the sidewalls of each of the two or more fins of the first set of fins and the second set of fins, wherein the plurality of gate metal portions each have a thickness about equal to a target thickness, wherein a top surface of each of the plurality of gate metal portions is coplanar with the top surface of each of the two or more fins of the first set of fins and the second set of fins.

2. The semiconductor structure of claim 1, wherein the dielectric layer is a high-k dielectric material.

3. The semiconductor structure of claim 1, wherein each fin of the first set of fins and the second set of fins are comprised of a doped silicon material.

4. The semiconductor structure of claim 1, wherein the target thickness is substantially equal to a spacing between each fin.

5. The semiconductor structure of claim 1, further comprising:
   an interlayer dielectric layer disposed on the shallow trench isolation oxide region.

6. The semiconductor structure of claim 5, wherein the interlayer dielectric layer is comprised of an oxide.

7. The semiconductor structure of claim 5, further comprising:
   a drain/source region above the two or more fins of the first set of fins and the second set of fins.

8. The semiconductor structure of claim 1, further comprising:
   a drain/source region above the two or more fins of the first set of fins and the second set of fins.

9. The semiconductor structure of claim 1, wherein the semiconductor structure is part of a vertical field effect transistor device.

10. The semiconductor structure of claim 7, wherein the semiconductor structure is part of a vertical field effect transistor device.

11. An integrated circuit, comprising:
    one or more semiconductor devices, wherein at least one of the one or more semiconductor devices comprises:
    a substrate;
    a first source/drain region disposed on the substrate;
    a second source/drain region disposed on the substrate;
    a shallow trench isolation oxide region disposed between the first source/drain region and the second source/drain region;
    a first set of fins comprising two or more fins disposed on the first source/drain region;
    a second set of fins comprising two or more fins disposed on the second source/drain region, wherein each of the two or more fins of the first set of fins and the second set of fins includes sidewalls and a top surface;
    a first spacer layer disposed on each of the first source/drain region and the second source/drain region and between each of the two or more fins of the first set of fins and the second set of fins;
    a dielectric layer disposed on the first spacer layer and along each of the sidewalls of the two or more fins of the first set of fins and the second set of fins; and
    a plurality of gate metal portions on at least a portion of the dielectric layer that is disposed along each of the sidewalls of each of the two or more fins of the first set of fins and the second set of fins, wherein the plurality of gate metal portions each have a thickness about equal to a target thickness, wherein a top surface of each of the plurality of gate metal portions is coplanar with the top surface of each of the two or more fins of the first set of fins and the second set of fins.

12. The integrated circuit of claim 11, wherein the dielectric layer is a high-k dielectric material.

13. The integrated circuit of claim 11, wherein each fin of the first set of fins and the second set of fins are comprised of a doped silicon material.

14. The integrated circuit of claim 11, wherein the target thickness is substantially equal to a spacing between each fin.

15. The integrated circuit of claim 11, further comprising:
    an interlayer dielectric layer disposed on the shallow trench isolation oxide region.

16. The integrated circuit of claim 15, wherein the interlayer dielectric layer is comprised of an oxide.

17. The integrated circuit of claim 15, further comprising:
    a drain/source region above the two or more fins of the first set of fins and the second set of fins.

18. The integrated circuit of claim 11, further comprising:
    a drain/source region above the two or more fins of the first set of fins and the second set of fins.

19. The integrated circuit of claim 11, wherein the integrated circuit is part of a vertical field effect transistor device.

20. The integrated circuit of claim 17, wherein the integrated circuit is part of a vertical field effect transistor device.

* * * * *